(12) United States Patent
Tanoue et al.

(10) Patent No.: US 7,642,778 B2
(45) Date of Patent: Jan. 5, 2010

(54) MRI APPARATUS

(75) Inventors: Kazuya Tanoue, Otawara (JP);
Katsutoshi Kokubun, Utsunomiya (JP);
Yoshiteru Watanabe, Nasushiobara (JP)

(73) Assignees: Kabushiki Kaisha Toshiba, Minato-ku, Tokyo (JP); Toshiba Medical Systems Corporation, Tochigi-Ken, Otawara-Shi (JP)

( * ) Notice: Subject to any disclaimer, the term of this patent is extended or adjusted under 35 U.S.C. 154(b) by 172 days.

(21) Appl. No.: 12/014,117

(22) Filed: Jan. 15, 2008

(65) Prior Publication Data

US 2008/0211496 A1 Sep. 4, 2008

(30) Foreign Application Priority Data

Jan. 16, 2007 (JP) ............................. 2007-007253

(51) Int. Cl.
*G01V 3/00* (2006.01)
(52) U.S. Cl. ....................... 324/312; 324/307
(58) Field of Classification Search ......... 324/300–322; 600/407–435
See application file for complete search history.

(56) References Cited

U.S. PATENT DOCUMENTS

| | | | | |
|---|---|---|---|---|
| 6,249,120 | B1 | 6/2001 | McKinnon et al. | |
| 6,458,081 | B1 * | 10/2002 | Matsui et al. | 600/437 |
| 7,075,302 | B2 * | 7/2006 | Zhu | 324/318 |
| 7,383,075 | B2 * | 6/2008 | Vu | 600/410 |
| 7,529,394 | B2 * | 5/2009 | Krishnan et al. | 382/128 |
| 2004/0254465 | A1 * | 12/2004 | Sano et al. | 600/443 |
| 2007/0282912 | A1 * | 12/2007 | Reiner | 707/104.1 |

FOREIGN PATENT DOCUMENTS

JP 10-14900 1/1998

* cited by examiner

*Primary Examiner*—Brij B Shrivastav
(74) *Attorney, Agent, or Firm*—Nixon & Vanderhye PC

(57) ABSTRACT

An MRI apparatus for performing an MRI examination to an object by sequentially applying an imaging method group, which is constituted by time-sequentially arranging a plurality of different imaging methods, to each of the imaging methods, has an imaging method group setting unit, a performing order setting unit and an imaging condition setting unit. The imaging method group setting unit sets the imaging method group. The performing order setting unit sets a performing order as a performing order of the imaging methods constituting the imaging method group. The imaging condition setting unit sets an imaging condition to each of the imaging methods. The workflow setting unit obtains an examination history data corresponding to the imaging method group, the performing order and the imaging condition from the examination history data previously stored to a storage unit, and sets a first workflow relating to the MRI examination by estimating an imaging time of each of the imaging methods in the performing order based on the obtained examination history data.

15 Claims, 5 Drawing Sheets

IMAGING TIME = MR SIGNAL COLLECTION TIME
+ IMAGE RECONSTRUCTION PROCESSING TIME
+ IMAGE PROCESSING TIME

MRI APPARATUS

BACKGROUND OF THE INVENTION

1. Technical Field of the Invention

The present invention relates to a magnetic resonance imaging (MRI) apparatus, and more particularly to an MRI apparatus capable of performing a plurality of different imaging methods time-sequentially based on a scan plan.

2. Related Art

An MRI is an imaging method of exciting the atomic nucleus spin of a tissue of an object (examined person such as a patient) placed in an static magnetic field by radio frequency signals (RF pulses) having the Larmor frequency thereof and reconstructing image data from magnetic resonance signals (MR signals) generated by the excitation.

The MRI apparatus is an image diagnosis apparatus for generating the image data based on the MR signal detected from the inside of a living body and indispensable in the present image diagnosis field because it is possible to obtain a lot of diagnosis information including not only dissection diagnosis information but also biochemical information, function diagnosis information, and the like.

In the MRI apparatus, various diagnosis image data relating to the object are collected by a main imaging to collect the image data used for a diagnosis to which, an imaging method group ordinarily constituted by time-sequentially arranging a plurality of different imaging methods, is time-sequentially applied. Then, the object is diagnosed based on the collected diagnosis image data. In this case, a scan plan is set by selecting an imaging condition of each of the imaging methods and a performing order for performing the plurality of imaging methods constituting the imaging method group using locator image data previously collected by, for example, a pilot imaging performed to the object, and the main imaging is performed based on the scan plan to collect the image data for the diagnosis (for example, it is mentioned in "Japanese Patent Application Publication No. 2006-231040").

When the scan plan is set, an imaging time necessary to perform each of the imaging methods is approximately determined by a time necessary to collect MR signals which use a predetermined pulse-sequence (data collection time) and a time necessary to an image reconstruction processing and an image processing performed to the thus obtained MR signals (data processing time). Then, prior to the MRI examination, when a doctor and an examination engineer (hereinafter, called operators) in charge of the object perform a plurality of imaging methods in parallel so that data processing periods do not overlap, they set the performing order in which an examination time necessary to perform a plurality of imaging methods time-sequentially is minimized as one of scan plans.

Incidentally, a receiving RF coil (receiving coil) disposed the MRI apparatus to detect MR signals is ordinarily composed of a plurality of coil elements (array coils) to obtain good receiving sensitivity. When the image data is generated by performing data processings such as the image reconstruction processing, the image processing, and the like to the MR signals detected by these coil elements, a high speed arithmetic operation processing unit disposed to an image data generating unit prevents an increase of a circuit scale by subjecting the MR signals of a plurality of channels obtained from the coil elements to parallel processing.

However, since a data processing time to the MR signals is also increased because recently a data amount is increased abruptly by arranging an array coil as multi-channel array coil, an imaging time in each of the imaging methods greatly depends on a data processing time in addition to a data collection time. Since the data processing time of the data obtained by each imaging method depends on whether or not the high speed arithmetic operation processing unit can perform parallel processing, how long parallel processing time the processing unit requires, and the like, it is difficult for the operators to accurately grasp the imaging time of each imaging method from the imaging condition set by the scan plan. Further, it is difficult to set a preferable performing order capable of minimizing the examination time required by the imaging method group constituted by the plurality of imaging methods.

SUMMARY OF THE INVENTION

The present invention has taken into consideration the above-described problems, and it is an object of the present invention to provide the MRI apparatus which an imaging time of an imaging method constituting an imaging method group, ordinarily constituted by time-sequentially arranging a plurality of different imaging methods, is able to be estimated based on past examination history data when image data relating to an object is generated by being applied the imaging method group every imaging method sequentially.

To solve the above-described problems, the present invention provides the MRI apparatus for performing an MRI examination to an object by sequentially applying an imaging method group, which is constituted by time-sequentially arranging a plurality of different imaging methods, comprising: an imaging method group setting unit configured to set the imaging method group; a performing order setting unit configured to set a performing order as a performing order of the imaging methods constituting the imaging method group; an imaging condition setting unit configured to set an imaging condition to each of the imaging methods; and a workflow setting unit configured to obtain an examination history data corresponding to the imaging method group, the performing order and the imaging condition from the examination history data previously stored to a storage unit, and to set a first workflow relating to the MRI examination by estimating an imaging time of each of the imaging methods in the performing order based on the obtained examination history data.

To solve the above-described problems, the present invention provides the MRI apparatus for performing an MRI examination to an object by sequentially applying an imaging method group, which is constituted by time-sequentially arranging a plurality of different imaging methods, comprising: an imaging method group setting unit configured to set the imaging method group; an imaging condition setting unit configured to set an imaging condition to each of the imaging methods; and a workflow setting unit configured to obtain an examination history data corresponding to the imaging method group and the imaging condition from the examination history data previously stored to a storage unit, and to set a workflow by estimating a performing order to be shortest time, by which it is estimated that the examination time necessary to time-sequentially perform the imaging method group is minimized.

DETAILED DESCRIPTION OF THE PREFERRED EMBODIMENTS

An embodiment of an MRI apparatus according to the present invention will be explained below referring to FIG. 1 to FIG. 5.

In the MRI apparatus of the embodiment described below, first, a first workflow relating to an MRI examination is set based on previously managed examination history data including imaging time data. Specifically, an imaging method of a main imaging, which is time-sequentially applied to an object, is set. When an imaging method group, which is constituted by time-sequentially arranging a plurality of different imaging methods, is set, a performing order of the imaging methods constituting the imaging method group is set by a scan plan. Next, an imaging condition of a main imaging is set to each of the imaging methods using locator image data collected by a pilot imaging performed to the object. Next, the examination history date, which corresponds to the imaging method group, the performing order and the imaging condition to be set, is obtained from the above examination history data. Next, the first workflow relating to an MRI examination is set by estimating the imaging time of each of the imaging methods based on the obtained examination history data.

Further, in the MRI apparatus of the embodiment, a second workflow (optimum workflow) relating to the MRI examination is set based on the previously managed examination history data. Specifically, the examination history data, which corresponds to the imaging method group and the imaging condition to be set, is primarily obtained from the above examination history data. Next, the examination history data, which has a shortest performing order by which an examination time necessary to time-sequentially perform the imaging method group is minimized, is secondarily obtained from the primarily obtained examination history data. Next, the second workflow relating to the MRI examination whose imaging time is estimated to each of the imaging methods is set based on the secondarily obtained examination history data.

Then, in the MRI apparatus of the embodiment, the main imaging is performed to collect diagnosis image data by the first workflow or the second workflow by selecting any of them.

(Arrangement of Apparatus)

An arrangement of the MRI apparatus of the embodiment will be explained using FIG. 1 to FIG. 4.

Figure 1:
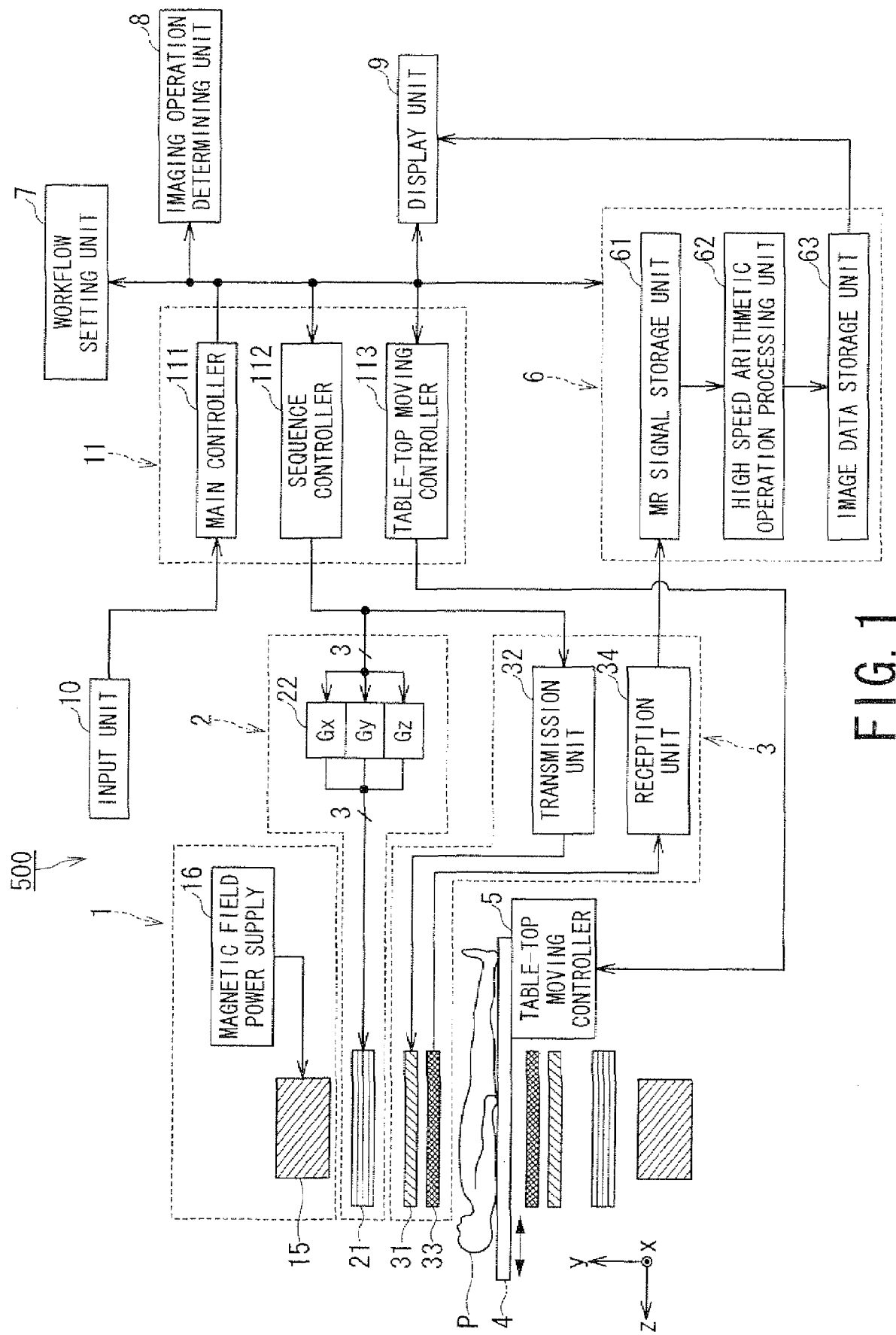
FIG. 1 is a block diagram showing an overall arrangement of the MRI apparatus in the embodiment.
Figure 2:
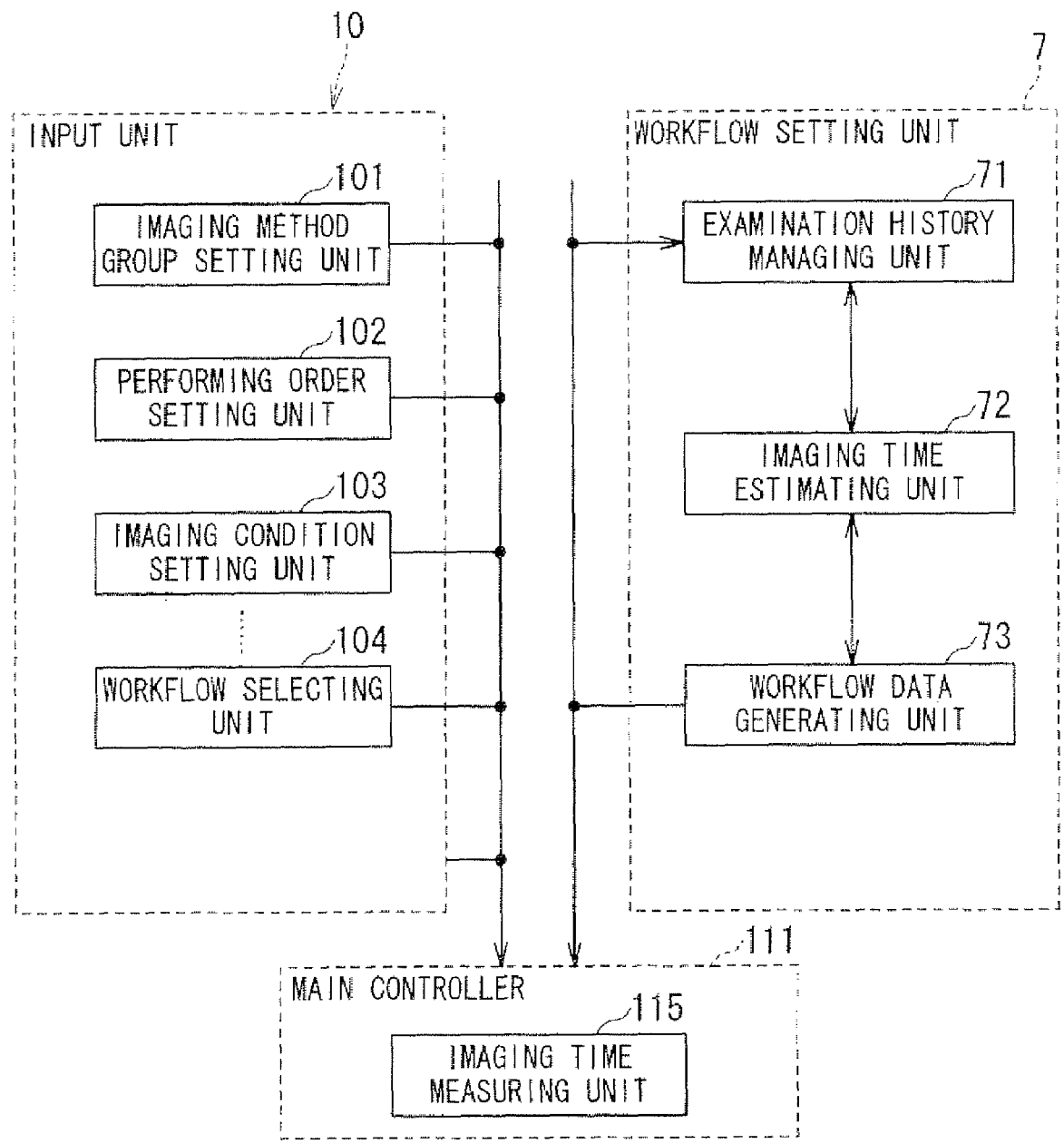
FIG. 2 a block diagram showing a specific arrangement of an input unit and a workflow setting unit provided with the MRI apparatus of the embodiment.

FIG. 1 is a block diagram showing an overall arrangement of the MRI apparatus in the embodiment, and FIG. 2 a block diagram showing a specific arrangement of an input unit and a workflow setting unit provided with the MRI apparatus.

The MRI apparatus 500 shown in FIG. 1 has a static magnetic field generating system 1 and a gradient magnetic fields generating system 2 for generating a magnetic field to a object P, a transmitting and receiving system 3 for irradiating RF pulses to the object P and receiving MR signals, a table-top 4 on which the object P is placed, a table-top 4 on which the object P is placed, a table-top moving system 5 for moving the table-top 4 in the body axis direction (z-axis direction) of the object P, and an image data generating system 6 for generating image data by subjecting the MR signals received by the transmitting and receiving system 3 to a reconstruction processing.

Further, the MRI apparatus 500 has a workflow setting unit 7, an imaging operation determining unit 8, a display unit 9, an input unit 10, and a controller system 11.

When it is intended to generate image data by sequentially applying the imaging method group, which is set to the object by the input unit 10, to each of the imaging methods, the workflow setting unit 7 sets a first workflow relating to the MRI examination by estimating an imaging time of each of the imaging methods in the performing order initially set by a scan plan. Further, the workflow setting unit 7 sets a second workflow relating to the MRI examination by estimating a shortest performing order, by which an examination time necessary to sequentially perform a plurality of imaging methods constituting the imaging method group set by the input unit 10 is minimized, an imaging time of each imaging method in the shortest performing order, and the like.

The imaging operation determining unit 8 determines whether an imaging operation during a main imaging according to the first workflow or the second workflow set by the workflow setting unit 7 is normal or not by comparing the imaging elapsed time of the imaging method during the main imaging with the imaging time of the imaging method in the main imaging included in the examination history data.

The display unit 9 displays image data such as locator image data, diagnosis image data, and the like generated by the image data generating system 6, workflow data set by the workflow setting unit 7, and the like.

The input unit 10 is manipulated by an operator to input signals to the MRI apparatus 500 to set the imaging method group, the performing order, the imaging condition, and the like.

The controller system 11 is composed of a processor and integrally controls the respective units of the MRI apparatus 500 described above.

The static magnetic field generating system 1 includes a main magnet 15, which is composed of, for example, an ordinary conductive magnet, a superconducting magnet, and the like, and a static magnetic field power supply 16 for supplying a current to the main magnet 15, and forms a strong static magnetic field to the object P placed in an imaging field of a not shown gantry. Note that the main magnet 15 described above may be composed of a permanent magnet.

The gradient magnetic field generating system 2 includes gradient magnetic field coils 21 for generating gradient magnetic fields in an x-axis direction, a y-axis direction, and a z-axis direction, which are orthogonal to each other, of the gantry (not shown) and a gradient magnetic field power supply 22 for supplying pulse currents to the respective gradient magnetic field coils 21.

The gradient magnetic field power supply 22 performs coding to the imaging field in which the object P is placed based on the sequence control signal supplied from the controller system 11. That is, the gradient magnetic field power supply 22 controls the pulse currents supplied to the gradient magnetic field coils 21 in the x-axis direction, the y-axis direction, and the z-axis direction of the gantry based on the sequence control signals to thereby form the gradient magnetic fields in the respective directions. At the time, the gradient magnetic fields in the x-axis direction, the y-axis direction, and the z-axis direction of the gantry are synthesized so that a slice selection gradient magnetic field Gs, a phase encode gradient magnetic field Ge, and a read-out (frequency encode) gradient magnetic field Gr which are orthogonal to each other are formed in desired directions, and these gradient magnetic fields are applied to the object P after they are superimposed in a static magnetic field formed by the main magnet 15.

The transmitting and receiving system 3 includes a transmission coil 31 and a transmitter unit 32 for irradiating the RF pulses to the object P and a receiving coil 33 and a receiver unit 34 for receiving MR signals generated by the object P. However, a transmission/reception coil having the functions of both the transmission coil 31 and the receiving coil 33 may be used.

The transmitter unit 32 generates RF pulse currents, which have a carrier wave having the same frequency as the magnetic resonance frequency (Larmor frequency) determined by the intensity of the static magnetic field of the main magnet 15 based on the sequence control signal supplied from a sequence controller 112 of the controller system 11 to be described later and is modulated by a predetermined selective excitation waveform. Further, the transmission coil 31 is driven by the RF pulse currents supplied from the transmitter unit 32 and irradiates the RF pulses to an imaging portion of the object P.

The receiving coil 33 is composed of, for example, a so-called array coil in which, for example, a plurality of coil elements are disposed to detect the MR signals generated by the object P with high sensitivity.

The receiver unit 34 includes an intermediate frequency conversion circuit, a phase detection circuit, an amplification circuit, a filtering circuit, and an analog to digital (A/D) converter of a not shown plurality of channels. The receiver unit 34 converts minute MR signals detected by the receiving coil 33 into an intermediate frequency and further performs A/D conversion after it performs signal processing such as phase detection, filtering, and the like.

The main magnet 15, the gradient magnetic field coil 21, the transmission coil 31, and the receiving coil 33 are disposed to the not shown gantry of the MRI apparatus 500, and the imaging field is formed to a central portion of the gantry. That is, the imaging field, into which the object P is inserted together with the table-top 4, is formed at the center of the gantry, and the receiving coil 33, the transmission coil 31, the gradient magnetic field coils 21, and the main magnet 15 are concentrically disposed around the periphery of the imaging field using the z-axis as a common axis.

The table-top 4 is mounted on the upper surface of a not shown bed installed in the vicinity of the gantry so as to slide in the z-axis direction and sets an interest region of the object P placed on the table-top 4 in the imaging field by moving the object P in the body axis direction. In this case, the movement of the table-top 4 in the body axis direction is controlled so that the interest region and the receiving coil 33 disposed around the interest region are located approximately at the center of the imaging field.

The table-top moving system 5 is mounted on, for example, the bed described above, generates drive signals based on the table-top mobile control signals supplied from the controller system 11, and moves the table-top 4 in the body axis direction at a predetermined speed in response to the drive signals.

The image data generating system 6 includes an MR signal storage unit 61, a high speed arithmetic operation processing unit 62, and an image data storage unit 63.

The MR signal storage unit 61 stores the MR signals, which are collected by a pilot imaging and subjected to the processings such as the intermediate frequency conversion, the phase detection, the A/D conversion, and the like by the receiver unit 34 of the transmitting and receiving system 3, or the MR signals which are collected by a main imaging, to which a different imaging method is applied, and which are subjected to the above processings.

The high speed arithmetic operation processing unit 62 has an image reconstruction processing unit and an image processing unit both of which are not shown. The image reconstruction processing unit generates locator image data (first image data) by subjecting the MR signals obtained by the pilot imaging and read out from the MR signal storage unit 61 to the image reconstruction processing performed by a two-dimensional Fourier transformation. Further the image reconstruction processing unit generates diagnosis image data (second image data) by subjecting the MR signals obtained by the main imaging and read out by the MR signal storage unit 61 to the image reconstruction processing performed by the two-dimensional Fourier transformation.

However, when the MR signals to a three-dimensional region are collected in the main imaging, the image reconstruction processing unit of the high speed arithmetic operation processing unit 62 generates volume data by subjecting the MR signals to the image reconstruction processing. Subsequently, the image processing unit of the high speed arithmetic operation processing unit 62 generates three-dimensional image data such as volume rendering image data, surface rendering image data and the like or two-dimensional image data such as maximum intensity projection (MIP) image data, multi planar reconstruction (MPR) image data, and the like as diagnosis image data, because predetermined image processing is performed for the volume data generated by the image reconstruction processing unit. Then, the locator image data and the diagnosis image data described above obtained by the high speed arithmetic operation processing unit 62 are stored to the respective storage regions of the image data storage unit 63.

Next, a specific arrangement and function of the workflow setting unit 7 will be explained using FIG. 2 and FIG. 3.

As shown in FIG. 2, the workflow setting unit 7 includes an examination history managing unit 71, an imaging time estimating unit 72, and a workflow data generating unit 73.

The examination history managing unit 71 manages the imaging time data of each of the imaging methods in the MRI examination, to which the plurality of imaging methods constituting the imaging method group are applied time-sequentially, as the examination history data together with the information of the imaging condition and the performing order which is supplementary information.

Specifically, prior to the MRI examination of the object P, the examination history managing unit 71 obtains the examination history data, which corresponds to the imaging method group, the performing order, and the imaging condition and the examination history data, which corresponds to the imaging method group, the shortest performing order, and the imaging condition, respectively from the examination history data stored to a storage device. Further, on the completion of the MRI examination of the object P, the examination history managing unit 71 generates new examination history and records it to the storage device as new examination history data. The new examination history is generated based on the imaging time measured by the main imaging performed in the MRI examination using the imaging method group, the performing order, and the imaging condition. Further, the examination history managing unit 71 sets new examination history, which corresponds to an imaging method group including a new imaging method, the performing order (scan plan) relating to the imaging method group including the new imaging method, and an imaging condition of each of the imaging methods as to the imaging method group including the new imaging method to manage the examination history data including the new imaging method which is not stored to the storage device and records the new examination history as the new examination history data.

Note that the imaging method is set based on the pulse-sequence of, for example, a field echo (FE), a spin echo (SE), a fast spin echo (FSE), a fast asymmetric spin echo (FASE), an echo planar imaging (EPI), a phase shift (PS), and the like and on a type of images, for example, a T1 weighted (T1W) image, a T2 weighted (T2W) image, a time of flight (TOF) image, a magnetic resonance angiography (MRA) image, and the like. In an imaging method in which it is necessary to inject an imaging agent, information of an imaging agent injection time and the like is also added to the imaging time data.

Further, parameters such as a signal to noise ratio (SNR) of the image, a TE (echo time), a TR (pulse-sequence repeat cycle), a data collection band, a pixel size, an image matrix size, the number of images, an imaging position, the number of coil elements of the receiving coil 33, and the like are set as the imaging condition. However, at least one of the imaging conditions which significantly affect the data collection time necessary to collect the MR signals and the data processing time necessary to the image reconstruction processing and the image processing, for example, at least one of the parameters such as the pixel size, the image matrix size, the number of images, and the number of coil elements of the receiving coil 33 may be used as the imaging condition in the supplementary information.

When the imaging time estimating unit 72 sets the first workflow relating to the MRI examination of the object P, it obtains the examination history data corresponding to the imaging method group, the performing order, and the imaging condition set by the input unit 10 from the examination history data managed by the examination history managing unit 71, and estimates the imaging time of each of the imaging methods based on the obtained examination history data.

Specifically, when the imaging time estimating unit 72 determines that the examination history data corresponding to the imaging method group, the performing order, and the imaging condition set by the input unit 10 is included in the examination history data managed by the examination history managing unit 71, it estimates the imaging time of each of the imaging methods based on the examination history data corresponding to the imaging method group, the performing order, and the imaging condition set by the input unit 10.

Note that, it is preferable that the imaging time estimating unit 72 make the determination based on whether or not the imaging method group, the performing order, and the imaging condition set by the input unit 10 are completely the same as those included in the examination history data. However, the imaging time estimating unit 72 may determine that imaging conditions are the same when the imaging method group and the performing order are the same and further the imaging conditions which significantly affect the data collection time necessary to collect the MR signals and the data processing time necessary to the image reconstruction processing and the image processing is the same, even if the other imaging conditions are different. When, for example, the imaging method group and the performing order are the same and further the parameters such as the pixel size, the image matrix size, the number of images, and the number of the coil elements of the receiving coil 33 are the same, the imaging time estimating unit 72 determines that both the imaging method groups, both the performing orders, and both the imaging conditions are the same.

In contrast, when the imaging time estimating unit 72 determines that the examination history data corresponding to the imaging method group, the performing order, and the imaging condition set by the input unit 10 is not included in the examination history data of the examination history managing unit 71, it obtains examination history data corresponding to the imaging method group, the performing order, and an imaging condition which are near to the imaging method group, the performing order, and the imaging condition set by the input unit 10 from the examination history data. In this case, the imaging time estimating unit 72 estimates the only one imaging time included in the obtained examination history data as an imaging time in the first workflow or estimates an imaging time in the first workflow based on the imaging time which is newly obtained by interpolating a plurality of imaging times included in the obtained examination history data.

Further, when the imaging time estimating unit 72 sets the second workflow relating to the MRI examination of the object P, it primarily obtains the examination history data corresponding to the imaging method group and the imaging condition set by the input unit 10 from the examination history data managed by the examination history managing unit 71. Further, the imaging time estimating unit 72 estimates an examination time necessary to time-sequentially perform the imaging method group to each performing order, based on the primarily obtained examination history data. Then, the imaging time estimating unit 72 secondarily obtains examination history data having the shortest performing order by which the examination time is minimized from the primarily obtained examination history data and estimates an imaging time of each of the imaging methods based on the secondarily obtained examination history data.

Note that when a plurality of imaging times are included to each imaging method in the examination history data corresponding to the imaging method group, the performing order, and the imaging condition set by the input unit 10, the imaging time estimating unit 72 ordinarily estimates the average value of the plurality of imaging times as the imaging time of each imaging method. However, the estimated imaging time is not limited to the average value, and the maximum value and the minimum value of the plurality of imaging times may be assumed as the imaging time of each imaging method.

When the first workflow is set, the workflow data generating unit 73 generates first workflow data in a predetermined format based on the performing order of the imaging method group supplied from the input unit 10 through the main controller system 11 and the imaging time of each of the imaging methods supplied from the imaging time estimating unit 72. Likewise, when the second workflow is set, the workflow data generating unit 73 generates second workflow data in a predetermined format based on the shortest performing order of the imaging method group supplied from the imaging time estimating unit 72 and the imaging time of each of the imaging methods in the shortest performing order.

Figure 3:
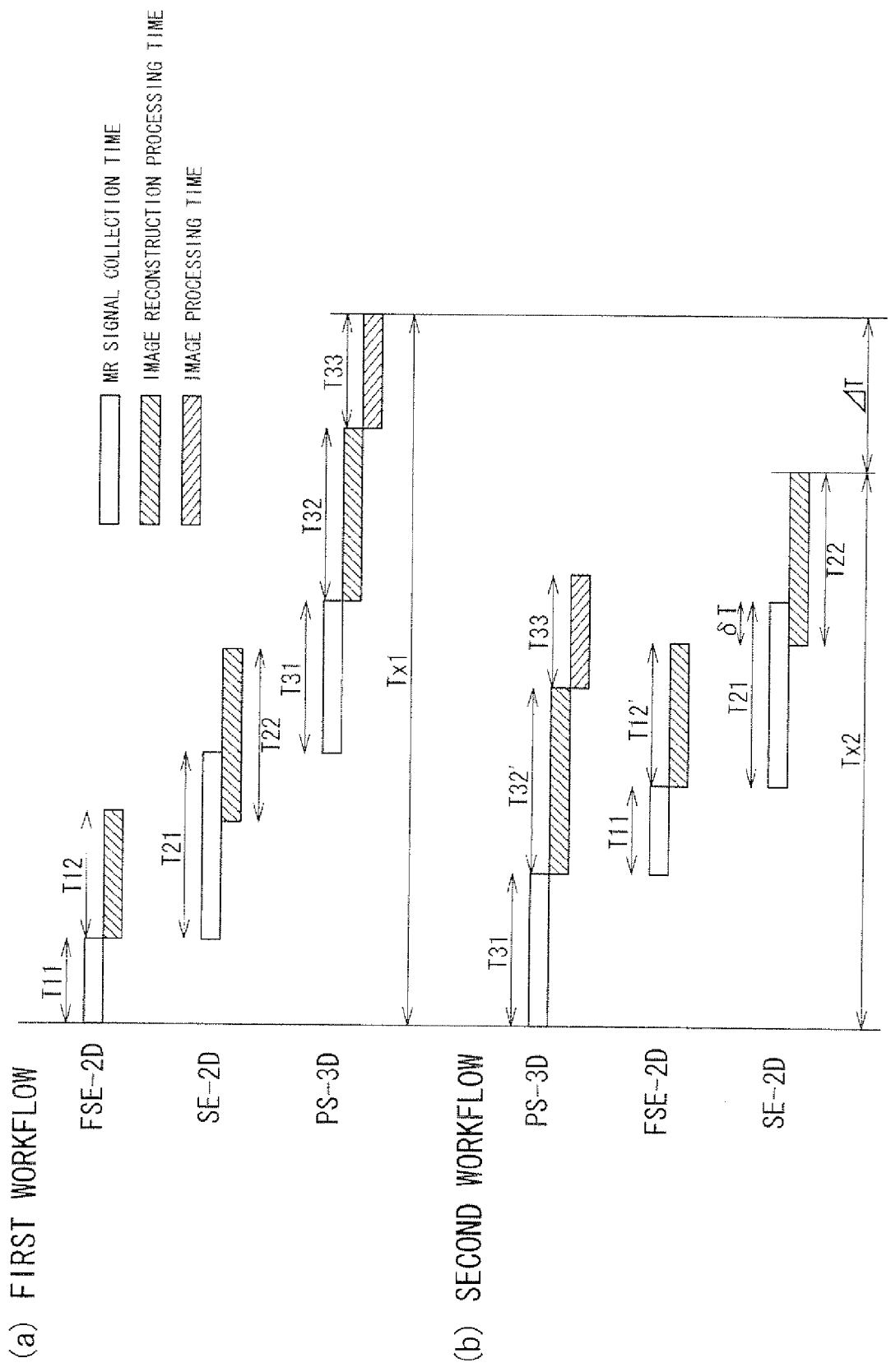
FIG. 3 is a view showing a specific example of workflow data generated by a workflow data generating unit provided with the MRI apparatus of the embodiment.

FIG. 3 is a view showing a specific example of the workflow data generated by the workflow data generating unit 73 provided with the MRI apparatus 500 of the embodiment.

FIG. 3 describes a case for time-sequentially performing the imaging method group which is constituted by, for example, the two-dimensional FSE for collecting T2W image data, the two-dimensional SE for collecting T1W image data, and the three-dimensional PS for collecting MAR image data.

A part (a) of FIG. 3 shows the first workflow data generated by the workflow data generating unit 73 of the workflow setting unit 7 based on the imaging methods (two-dimensional FSE, two-dimensional SE, and three-dimensional PS)

and the performing order (two-dimensional FSE→two-dimensional SE→three-dimensional PS) selected or set by the operator through the input unit 10 at an initial setting step. The times T11 and T12 of the two-dimensional FSE in the first workflow data are the estimated values of an MR signal collection time and an image reconstruction processing time which are obtained as a result that the imaging time estimating unit 72 obtains the examination history data corresponding to the imaging method group, the performing order, and the imaging condition.

Further, the times T21 and T22 in the two-dimensional SE and the times T31, T32, and T33 in the three-dimensional PS are the estimated values of the MR signal collection time, the image reconstruction time, and the image processing time obtained by the same method. Note that "Tx1" of the first workflow data shows the estimated examination time, needed by the main imaging, which is necessary when the two-dimensional FSE, the two-dimensional SE, and the three-dimensional PS are time-sequentially performed described above. When the processings other than the MR signals collection processing and the image reconstruction processing in the two-dimensional SE cannot be performed in parallel, the estimated examination time Tx1 in the first workflow is shown by Tx1=T11+T21+T31+T32+T33.

In contrast, a part (b) of FIG. 3 shows the second workflow data generated by the workflow data generating unit 73 of the workflow setting unit 7. The second workflow data shows the performing order (three-dimensional PS→two-dimensional FSE→two-dimensional SE) by which the examination time necessary to time-sequentially perform the imaging method group is minimized, the MR signal collection time, the image reconstruction processing time, and the image processing time in each of the imaging methods, and the estimated examination time Tx2 which is necessary when an imaging is time-sequentially performed using the three-dimensional PS, the two-dimensional FSE, and the two-dimensional SE described above.

That is, the times T31, T32' (T32'>T32), and T33 in three-dimensional PS shown in the second workflow data are the estimated values of the MR signal collection time, the image reconstruction processing time, and the image processing time T33 which are obtained as a result that the imaging time estimating unit 72 obtains the examination history data corresponding to the imaging method group, the shortest performing order, the imaging condition, and the like. Further, the times T11 and T12' (T12'>T12) in the two-dimensional FSE and the times T21 and 722 in the two-dimensional SE are the estimated values of the MR signal collection time and the image reconstruction processing time obtained by the same method, respectively. When the period during which the MR signal collection and the image reconstruction processing are performed in parallel in the two-dimensional SE is shown by δT, the examination time Tx2 in the second workflow data is shown by Tx2=T31+T11+T21+T22−δT.

Accordingly, the difference ΔT between the examination time Tx1 in the first workflow data and the examination time Tx2 in the second workflow data is shown by ΔT=T32+T33−T22+δT. Since ΔT>0 because T32>T22 is ordinarily established, it is possible to reduce the examination time of the main imaging by the second workflow.

Note that since the image reconstruction processing of the three-dimensional PS and the image reconstruction processing of the two-dimensional FSE are performed using the common high speed arithmetic operation processing unit 62 in the second workflow data shown in the part (b) of FIG. 3, from which T32'>T32 and T12'>T12 are obtained. However, the influence described above to the examination time Tx2 can be excluded by selecting the performing order (three-dimensional PS→two-dimensional FSE→two-dimensional SE).

Further, the display unit 9 shown in FIG. 1 includes a display data generating unit, a data conversion unit, and a monitor (any of which are not shown) so that the diagnosis image data and the locator image data generated by the image data generating unit 6, the first workflow data, the second workflow data generated by the workflow data generating unit 73, and further the result of determination of the imaging operation and the like supplied from the imaging determining unit 8 are displayed thereon. That is, the display data generating unit generates display data by adding information such as object information, the information of the imaging condition, and the like to the image data, the workflow data, and the like described above. The data conversion unit subjects the display data, which is converted into a predetermined display format, to D/A conversion and displays the resultant display data on a cathode ray tube (CRT) or a monitor composed of a liquid crystal panel.

Next, when the imaging method group is time-sequentially performed based on the first workflow or the second workflow set by the workflow setting unit 7, the imaging operation determining unit 8 calculates an allowable imaging time by adding a predetermined margin to the imaging time included in the examination history data managed by the examination history managing unit 71. Further, when a plurality of imaging times are managed to the same the imaging method group, the same imaging condition, and the same performing order by the examination history managing unit 71 as described already, the allowable imaging time is calculated by adding a margin to, for example, the maximum value of the plurality of imaging times.

Further, the imaging operation determining unit 8 compares the imaging elapsed time of the imaging method, performed just now, which is supplied from a main controller 111 with the allowable imaging time, and when the imaging elapsed time exceeds the allowable imaging time, the imaging operation determining unit 8 determines that the imaging operation of the imaging method performed just now is abnormal. Next, the imaging operation determining unit 8 notifies the operator of a result of the determination by displaying it on a monitor of the display unit 9, a display panel disposed to the input unit 10 to be described later, and the like.

Figure 4:
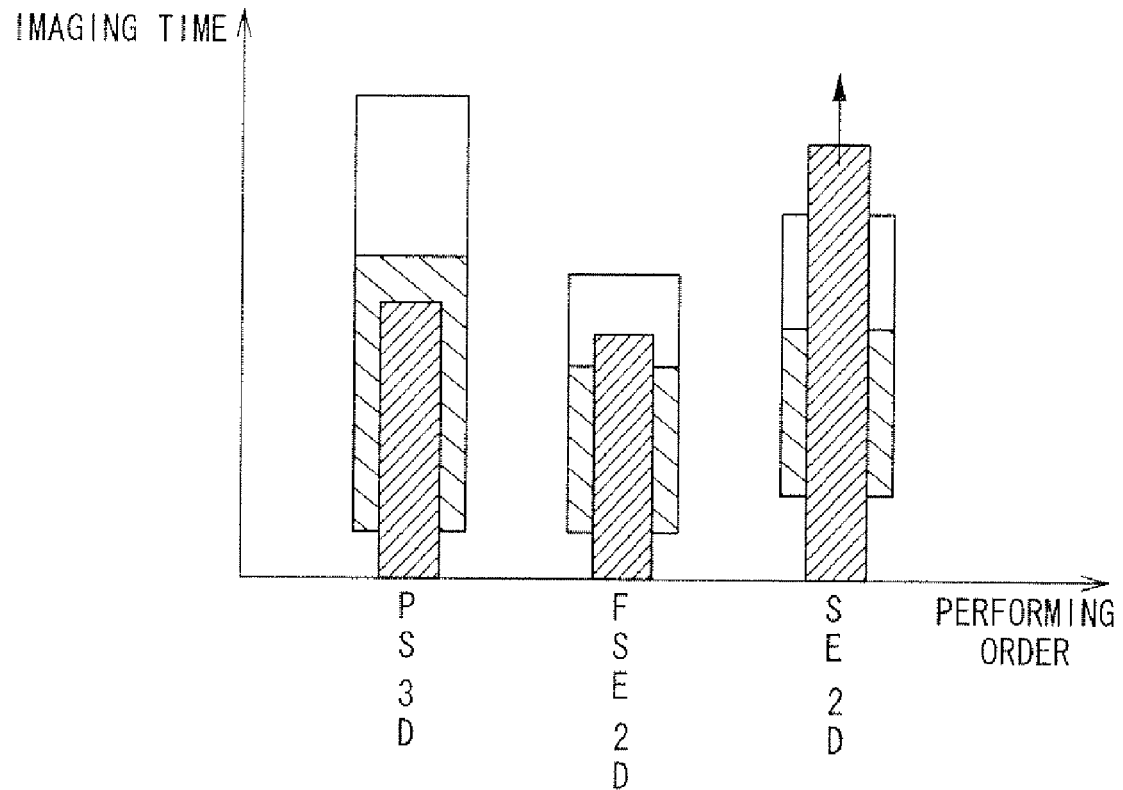
FIG. 4 is a view showing a frame format of a method of determining an imaging operation performed by a imaging operation determining unit provided with the MRI apparatus of the embodiment.
Figure 4:
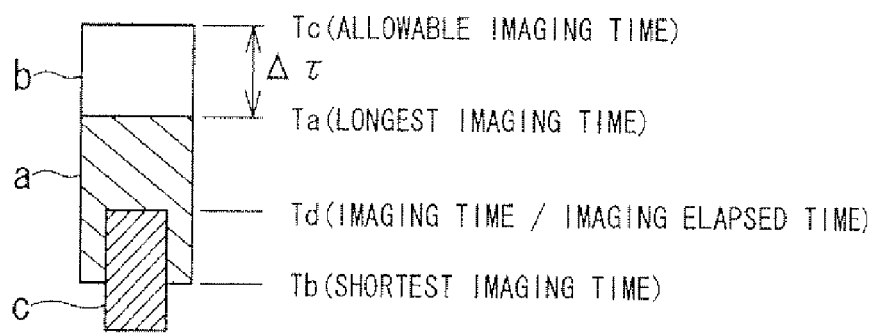

FIG. 4 is a view showing a frame format of a method of determining an imaging operation performed by the imaging operation determining unit 8 provided with the MRI apparatus of the embodiment 500.

In FIG. 4, a horizontal axis of FIG. 4 shows the respective imaging methods of the three-dimensional PS, the two-dimensional FS, and the two-dimensional SE corresponding to the second workflow shown in the part (b) of FIG. 3, and a vertical axis shows an imaging time, respectively. Then, an upper edge Ta and a lower edge Tb of a rectangle a in each of the imaging methods show the longest imaging time and the shortest imaging time when a plurality of imaging time data are managed by the examination history managing unit 71 to the imaging methods of the same imaging condition and the same performing order, and an upper edge Tc of a rectangle b shows an allowable imaging time set by adding a margin Δτ of, for example, 50% to the longest imaging time. On the other hand, the upper edge Td of a rectangle "c" which is shown by superimposing a rectangle "a" and the rectangle "b" shows an imaging time required to each of the imaging methods or an imaging elapsed time in an imaging method performed just now.

That is, FIG. 4 shows a case that the imaging by the three-dimensional PS method and the two-dimensional FSE method in the performing order (three-dimensional PS→two-dimensional FSE→two-dimensional SE) has been completed, and the imaging by the two-dimensional SE is being performed just now. At the time, the upper edges Td of the rectangles "c" shown in the three-dimensional PS and the two-dimensional FSE show the imaging times required by these imaging methods, and further the upper edge Td of the rectangle "c" shown in the two-dimensional SE method shows the imaging elapsed time required by the imaging. When the imaging elapsed time exceeds the allowable imaging time shown by the upper edge Tc of the rectangle "b", the imaging operation determining unit 8 determines that the imaging of the two-dimensional SE is abnormal.

Next, the input unit 10 of FIG. 1 is an interactive interface having input devices such as a display panel, a switch, a keyboard, a mouse, and the like on an operation table. The input unit 10 includes an imaging method group setting unit 101, a performing order setting unit 102, an imaging condition setting unit 103, and a workflow selecting unit 104.

The imaging method group setting unit 101 initially sets an imaging method group selected by the operator based on a type of image and the pulse-sequence.

The performing order setting unit 102 initially sets the performing order of a plurality of imaging methods, which constitute the imaging method group set by the imaging method group setting unit 101, using a scan plan.

The imaging condition setting unit 103 sets the imaging condition of each of the imaging methods constituting the imaging method group set by the imaging method group setting unit.

The workflow selecting unit 104 selects any of the first workflow and the second workflow set by the workflow setting unit 7.

Further, the object information is input, an imaging mode is selected, and various types of command signals are input using the input unit 10 such as the display panel, the input device, and the like described above.

The controller system 11 includes a main controller 111, a sequence controller 112, and a table-top moving controller 113. The main controller 111 includes a CPU and a memory circuit both of which are not shown and has a function for integrally controlling the MRI apparatus 500. The memory circuit of the main controller 111 stores the input information, the setting information, the selecting information, and the like input from the input unit 10. On the other hand, the CPU of the main controller 111 generates pulse-sequence information (for example, the information as to the magnitude, the supply time, the timing of supply, and the like of the pulse current to be supplied to the gradient magnetic field coils 21 and the transmission coil 31) based on the above information input from the input unit 10 and supplies the thus generated pulse-sequence information to the sequence controller 112.

Further, the main controller 111 includes an imaging time measuring unit 115 as shown in FIG. 2 and measures an imaging time and an imaging elapsed time in an imaging operation performed by various types of imaging methods. After the completion of MRI examination (each time an imaging operation is completed using each imaging method), the imaging time required by the imaging operation of each imaging method is related to the information of the imaging method group, the performing order, the imaging condition, and the like and additionally stored to a storage device (not shown) through the examination history managing unit 71 of the workflow setting unit 7. On the other hand, the imaging elapsed time obtained in the imaging method performed just now is supplied to the imaging operation determining unit 8 to determine whether an imaging operation is normal or abnormal.

In contrast, the sequence controller 112 generates sequence control signals based on the pulse-sequence information supplied from the main controller 111 and controls the gradient magnetic field power supply 22 of the gradient magnetic fields generating system 2 and the transmitter unit 32 of the transmitting and receiving system 3. Further, the table-top moving controller 113 generates drive signals for moving the table-top 4 based on the table-top mobile instruction signals supplied from the input unit 10 through the main controller 111 and supplies the drive signals to the table-top moving system 5.

(Procedure for Setting Work Flow)

Next, a procedure for setting a workflow in the MRI apparatus of the embodiment 500 will be explained using a flowchart of FIG. 5.

Prior to the MRI examination of the object P, the operator of the MRI apparatus 500 inputs the attribute information of the object (patient name, patient ID (identification), and the like) using the input unit 10. Further, the operator sets the imaging method group, which is constituted by time-sequentially arranging the plurality of different imaging methods, the performing order used when the imaging method group is performed, and the like. Thereafter, the operator inputs instruction signals using the input unit 10 to move the table-top 4 to a desired position. In contrast, the table-top moving controller 113 of the controller 11 supplies drive signals to the table-top moving system 5 according to the table-top mobile instruction signals supplied from the input unit 10 through the main controller 111 and moves the table-top 4 in the body axis direction so that the interest region of the object P placed on the table-top 4 is located in an approximately central portion of the imaging field formed to the gantry of the MRI apparatus 500 (step S1 of FIG. 5).

On the completion of initial setting at step S1, the operator inputs an imaging start command signal after he or she selects a pilot imaging mode through the input unit 10. A pilot imaging is started to the interest region of the object P in response to the input, and image data of, for example, the coronal cross section (longitudinal cross section viewed from a front surface), the sagittal cross section (longitudinal cross section viewed from side surface), and the axial cross section (lateral cross section) of the object are generated and displayed. That is, the main controller 111 of the controller system 11, which receives the imaging start command signal from the input unit 10, supplies an instruction signal for performing a pilot imaging by the respective imaging methods, which constitute the imaging method group initially set to the sequence controller 112, and the imaging condition. The sequence controller 112 generates a control signal based on the information. Then, the pilot imaging is performed on the above respective cross sections by supplying the control signal to the gradient magnetic field generating system 2 and the transmitting and receiving system 3.

Figure 5:
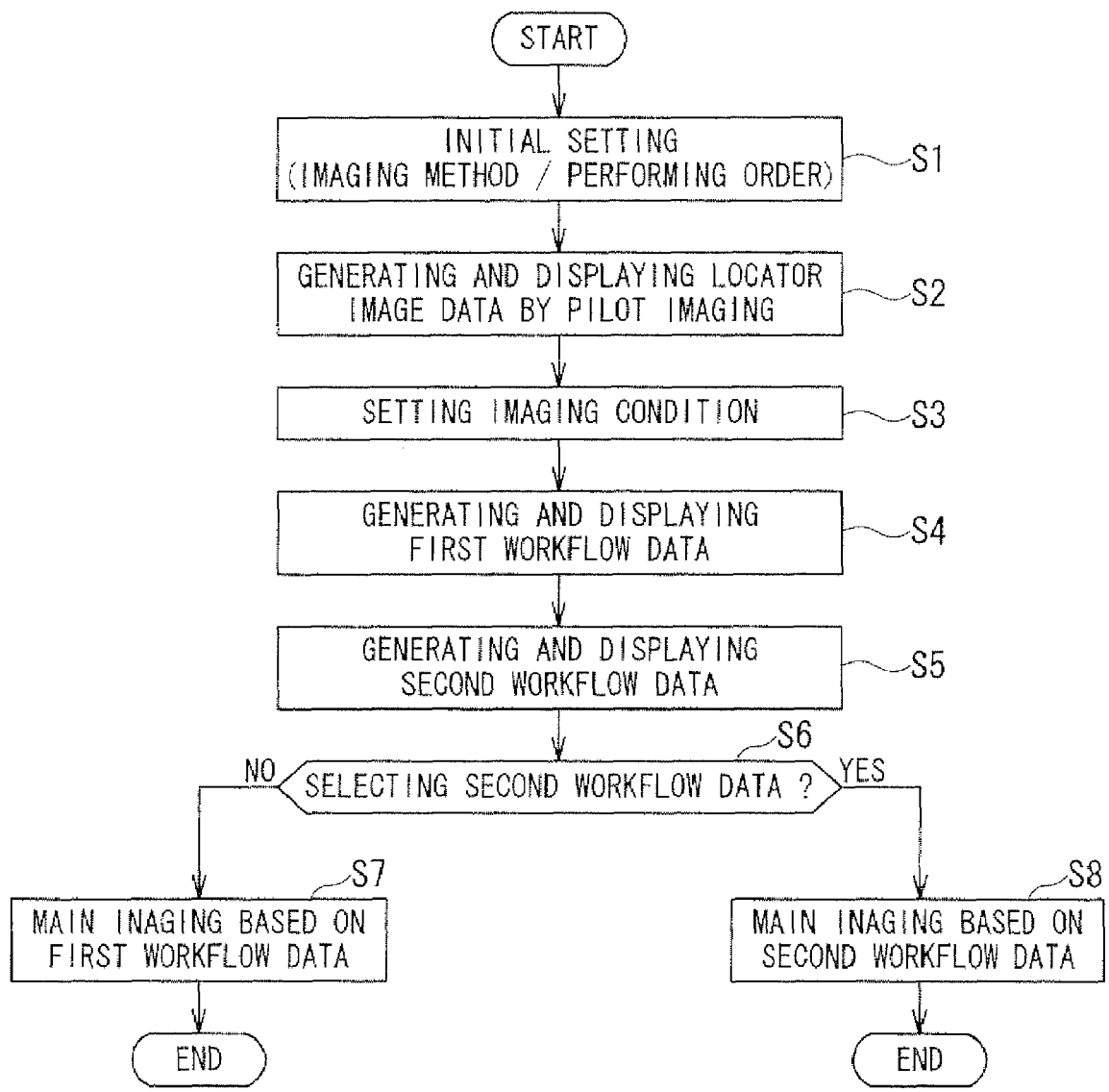
FIG. 5 is a flowchart showing setup steps of a workflow in the MRI apparatus of the embodiment.

Next, the operator selects the image data on, for example, the coronal cross section as locator image data using the input device of the input unit 10 from the above image data collected by the pilot imaging and displays it on the monitor of the display unit 9 (step S2 of FIG. 5). Next, the operator sets the imaging condition of each of the imaging methods constituting the imaging method group initially set at step S1 referring to the locator image data displayed on the display unit 9 (step S3 of FIG. 5).

In contrast, the imaging time estimating unit 72 of the workflow setting unit 7, which receives the imaging information such as the imaging method group, the performing order, the imaging condition, and the like set by the input unit 10 through the main controller 111 of the system control system 11 obtains the examination history data corresponding to the imaging method group, the performing order, and the imaging condition from the examination history data managed by the examination history managing unit 71 and estimates the imaging time of each of the imaging methods based on the obtained examination history data.

Next, the workflow data generating unit 73 generates the first workflow data as shown in, for example, the part (a) of FIG. 3 based on the performing order of the group imaging method supplied from the input unit 10 through the main controller 111 and on the imaging time of each of the imaging methods supplied from the imaging time estimating unit 72. Then, the obtained first workflow data is displayed on the monitor of the display unit 9 (step S4 of FIG. 5).

Next, the imaging time estimating unit 72 primarily obtains the examination history data corresponding to the imaging method group and the imaging condition initial set by the operator through the input unit 10 from the examination history data managed by the examination history managing unit 71 and estimates the shortest performing order by which the examination time necessary to time-sequentially perform the plurality of imaging methods constituting the imaging method group based on the primarily obtained examination history data. Further, the imaging time estimating unit 72 secondarily obtains the examination history data corresponding to the shortest performing order from the primarily obtained examination history data.

In contrast, the workflow data generating unit 73 generates the second workflow data as shown in, for example, the part (b) of FIG. 3 based on the shortest performing order and the imaging time of the imaging method group supplied from the imaging time estimating unit 72 and displays it on the monitor of the display unit 9 (step S5 of FIG. 5).

The operator, who observes the first workflow data and the second workflow data on the monitor of the display unit 9, selects any of the first workflow based on the initial set performing order and the second workflow by which the examination time described above is minimized (step S6 of FIG. 5).

The main controller 111, which receives the selected signal from the input unit 10, integrally controls the respective units of the MRI apparatus 500 according to the selected signal and performs the main imaging based on the first workflow or the second workflow (steps S7 and S8 of FIG. 6).

According to the embodiment of the present invention described above, when the MRI examination is performed to the object by sequentially applying the imaging method group, which is constituted by time-sequentially arranging the plurality of different imaging methods, to each of the imaging methods, it is possible to accurately grasp the imaging time of each of the imaging methods and the examination time necessary to time-sequentially perform the imaging method group by obtaining the examination history data, which corresponds to the imaging method group selected before the examination, the performing order used when the imaging method group is performed, and the imaging condition of each of the imaging methods constituting the imaging method group, from the previously managed examination history data.

Further, since the shortest performing order by which the examination time necessary to time-sequentially perform the imaging method can be easily set, it is possible to set an optimum performing order at all times without depending on the experience and the like of the operator by obtaining the examination history data, which corresponds to the imaging method group selected before the examination and to the imaging condition of each of the imaging methods constituting the imaging method group, from the previously managed examination history data. As a result, according to the embodiment, not only the efficiency of the MRI examination can be improved but also the burden of the operator can be greatly reduced.

Although the embodiment of the present invention has been described above, the present invention is not limited to the embodiment described above and may be embodied by being modified. Although the above embodiment describes, for example, the case in which the first workflow, which confirms the imaging time of each of the imaging methods in performing order selected by the operator, and the second workflow, which sets the performing order by which the examination time necessary to time sequentially perform the imaging method group selected by the operator is minimized, are continuously set, any one of the first workflow and the second workflow may be set.

The above embodiment describes the two-dimensional FSE method for collecting the T2W image data, the two-dimensional SE for collecting the T1W image data, and the three-dimensional PS for collecting the MRA image data as the imaging method, the embodiment is not limited thereto.

Further, although the first workflow is set in the embodiment described above to estimate the imaging time of each of the imaging methods when the imaging method group is time-sequentially performed, it is also possible to estimate the imaging time of one imaging method, which is selected by the operator, by the same method.

In contrast, the performing order, by which the examination time necessary to time-sequentially perform the imaging method group is minimized, may be set again in such a manner that the input unit 10 of the embodiment described above changes an imaging condition or adds or deletes an imaging method while an MRI examination is being performed, and the workflow setting unit 7 obtains the examination history data corresponding to an updated imaging method group or to the imaging condition of each of the imaging methods constituting the updated imaging method group. In this case, the second workflow data generated based on the updated performing order and imaging method is newly displayed on the display unit 9.

What is claimed is:

1. An MRI apparatus for performing an MRI examination to an object by sequentially applying an imaging method group, which is constituted by time-sequentially arranging a plurality of different imaging methods, to each of the imaging methods, comprising:

an imaging method group setting unit configured to set the imaging method group;

a performing order setting unit configured to set a performing order as a performing order of the imaging methods constituting the imaging method group;

an imaging condition setting unit configured to set an imaging condition to each of the imaging methods; and a workflow setting unit configured to obtain an examination history data corresponding to the imaging method group, the performing order and the imaging condition from the examination history data previously stored to a storage unit, and to set a first workflow relating to the MRI examination by estimating an imaging time of each of the imaging methods in the performing order based on the obtained examination history data.

2. An MRI apparatus according to claim 1, wherein the workflow setting unit comprises:

an examination history managing unit configured to manage the examination history data in the MRI examination;

an imaging time estimation unit configured to estimate the imaging time of each of the imaging methods in the performing order by obtaining the examination history data corresponding to the imaging method group, the performing order, and the imaging condition from the examination history data; and a workflow data generating unit configured to generate first workflow data in which the first workflow is shown, based on the imaging time of each of the imaging methods in the performing order.

3. An MRI apparatus according to claim 2, wherein the examination history managing unit records the imaging time necessary to the imaging of each of the imaging methods as the examination history data to the storage unit by relating the imaging time to the performing order and the imaging condition after the MRI examination is finished.

4. An MRI apparatus according to claim 1, wherein the workflow setting unit primarily obtains the examination history data corresponding to the imaging method group and the imaging condition from the examination history data, secondarily obtains examination history data having the shortest performing order, by which it is estimated that the examination time necessary to time-sequentially perform the imaging method group is minimized from the primarily obtained examination history data, and sets a second workflow relating to the MRI examination by estimating an imaging time of each of the imaging methods in the shortest performing order based on the secondarily obtained examination history data.

5. An MRI apparatus according to claim 4, further comprising:

an imaging time measuring unit configured to measure an imaging elapsed time in each of the imaging methods while the MRI examination is being performed;

an imaging operation determining unit configured to determine whether an imaging operation is performed normally or not; and a notifying unit configured to notify a result of the determination, wherein, when the imaging elapsed time exceeds a previously set allowable imaging time, the image operation determining unit determines that the imaging operation of the imaging method, which is performed at the time the allowable imaging time is exceeded, is abnormal.

6. An MRI apparatus according to claim 5, wherein the image operation determining unit sets the allowable imaging time based on the imaging time of the imaging method in the first workflow or the second workflow.

7. An MRI apparatus according to claim 4, wherein:

the imaging time estimation unit estimates the shortest performing order by which the examination time is minimized and the imaging time in each of the imaging methods when the shortest performing order is employed by obtaining the examination history data corresponding to the imaging method group and the imaging condition; and the workflow data generating unit generates second workflow data in which the second workflow is shown based on the imaging time of each of the imaging methods in the shortest performing order.

8. An MRI apparatus according to claim 4, further comprising a workflow selecting unit configured to select any one of the first workflow and the second workflow as a performed workflow relating to the MRI examination.

9. An MRI apparatus according to claim 8, further comprising a workflow displaying unit configured to display the first workflow and the second workflow, wherein the workflow selecting unit selects any one of the first workflow and the second workflow as the performed workflow relating to the MRI examination, based on the first workflow data and the second workflow data displayed by the workflow display unit.

10. An MRI apparatus for performing an MRI examination to an object by sequentially applying an imaging method group, which is constituted by time-sequentially arranging a plurality of different imaging methods, to each of the imaging methods, comprising:

an imaging method group setting unit configured to set the imaging method group;

an imaging condition setting unit configured to set an imaging condition to each of the imaging methods; and a workflow setting unit configured to obtain an examination history data corresponding to the imaging method group and the imaging condition from the examination history data previously stored to a storage unit, and to set a workflow by estimating a performing order to be shortest time, by which it is estimated that the examination time necessary to time-sequentially perform the imaging method group is minimized.

11. An MRI apparatus according to claim 10, wherein the workflow setting unit comprises:

an examination history managing unit configured to manage the examination history data in the MRI examination;

an imaging time estimation unit configured to estimate an imaging time of each of the imaging methods in each of performing orders by obtaining the examination history data corresponding to the imaging method group and the imaging condition from the examination history data; and a workflow data generating unit configured to generate workflow data in which the workflow is shown, based on the imaging time of each of the imaging methods in the performing orders.

12. An MRI apparatus according to claim 11, wherein:

the imaging time estimation unit primarily obtains the examination history data corresponding to the imaging method group and the imaging condition from the examination history data, secondarily obtains the examination history data having the shortest performing order from the primarily obtained examination history data, and estimates an imaging time of each of the imaging methods based on the secondarily obtained examination history data; and the workflow data generating unit generates workflow data based on the imaging time of each of the imaging methods in the shortest imaging order.

13. An MRI apparatus according to claim 11, wherein the examination history managing unit records the imaging time necessary to the imaging of each of the imaging methods as the examination history data to the storage unit by relating the imaging time to the performing order and the imaging condition after the MRI examination is finished.

14. An MRI apparatus according to claim 10, further comprising:

an imaging time measuring unit configured to measure an imaging elapsed time in each of the imaging methods while the MRI examination is being performed;

an imaging operation determining unit configured to determine whether an imaging operation is performed normally or not; and a notifying unit configured to notify a result of the determination, wherein, when the imaging elapsed time exceeds a previously set allowable imaging time, the image operation determining unit determines that the imaging operation of the imaging method, which is performed at the time the allowable imaging time is exceeded, is abnormal.

15. An MRI apparatus according to claim 14, wherein the image operation determining unit sets the allowable imaging time based on the imaging time of the imaging method in the workflow.

* * * * *